United States Patent
Avivi et al.

(10) Patent No.: US 9,780,945 B1
(45) Date of Patent: Oct. 3, 2017

(54) METHODS AND DEVICES FOR SPUR CANCELLATION IN DIGITAL PHASE LOCKED LOOPS

(71) Applicant: Intel IP Corporation, Santa Clara, CA (US)

(72) Inventors: Rotem Avivi, Petah-Tikwa (IL); Michael Kerner, Tel Mond (IL)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 15/088,388

(22) Filed: Apr. 1, 2016

(51) Int. Cl.
*H04L 7/033* (2006.01)
*H04B 15/02* (2006.01)

(52) U.S. Cl.
CPC ........... *H04L 7/0331* (2013.01); *H04B 15/02* (2013.01)

(58) Field of Classification Search
CPC ... H03L 2207/50; H03L 7/085; H03L 7/0991; H03L 7/091; H03L 7/093; H03L 1/027; H03L 2207/06; H03L 7/16; H03L 7/1075; H03L 7/113; H03L 7/08; H03D 2200/0025; H03D 7/165; H04L 27/12; H04L 27/367; H04L 27/368; H04L 7/0331; H03C 3/0941; H03C 3/095; H03C 3/0966; H03C 5/00; H04B 1/0475; H04J 1/12

See application file for complete search history.

(56) References Cited

U.S. PATENT DOCUMENTS

| | | | | |
|---|---|---|---|---|
| 9,172,570 B1* | 10/2015 | Li Puma | ................. | H04L 27/04 |
| 2006/0115019 A1* | 6/2006 | Jensen | ..................... | H03D 3/24 |
| | | | | 375/327 |
| 2007/0047121 A1* | 3/2007 | Eleftheriou | ...... | G11B 20/10009 |
| | | | | 360/51 |
| 2009/0141845 A1* | 6/2009 | Ballantyne | ............. | H03L 7/085 |
| | | | | 375/376 |
| 2010/0188148 A1* | 7/2010 | Mehta | ................... | H03F 1/3247 |
| | | | | 330/149 |
| 2013/0043907 A1* | 2/2013 | Paillard | ..................... | H03L 7/02 |
| | | | | 327/7 |
| 2014/0133528 A1* | 5/2014 | Noest | ................... | H04B 1/0475 |
| | | | | 375/219 |

* cited by examiner

*Primary Examiner* — Khanh C Tran
(74) *Attorney, Agent, or Firm* — Schwegman Lundberg & Woessner, P.A.

(57) ABSTRACT

Embodiments related to systems, methods, and computer-readable media to enable a digital phase locked loop are described. In one embodiment, a digital synthesizer comprises a digital phase locked loop with detection circuitry to calculate an estimate of a magnitude and a phase of a spurious response from an error signal within the digital phase locked loop. The digital phase locked loop further comprises generation circuitry to generate an inverse spur based on the estimate of the magnitude and the phase, and further comprises injection circuitry to inject the inverse spur into the digital phase locked loop. In some embodiments, least mean squares (LMS), recursive least squares (RLS), or other such adaptation is used to estimate the magnitude and phase of the spurious response.

27 Claims, 10 Drawing Sheets

METHODS AND DEVICES FOR SPUR CANCELLATION IN DIGITAL PHASE LOCKED LOOPS

TECHNICAL FIELD

Embodiments pertain to systems, methods, and component devices for wired and wireless communications systems, radar systems, and frequency synthesis and clock synthesis systems. These systems are particularly used in mobile communication systems such as 3G, 4G, and 5G, in wireless local area network (WLAN) communication systems for standards such as 802.11 and in high speed microprocessor clock distribution circuits. Embodiments particularly pertain to those devices in which spurious free dynamic range is a significant factor affecting performance and compliance with regulatory standards.

BACKGROUND

Electronic phase locked loops have been employed in communications, radar, computers, and other electronic devices for systems since the early 1920's. They were originally employed in direct conversion receivers and televisions to synchronize horizontal and vertical picture sweeps. Today they are used widely in communication systems for frequency synthesis, synchronization of carrier and clock and data recovery, radar systems, clock trees in high speed microprocessors and digital systems tone decoders, video signals, and many other applications. In more recent history, their use has transitioned more into Digital Signal Processing systems in the form of Digital Phase Locked Loops (DPLL).

Frequency generation is an important function performed in both transmitters and receivers for accurate frequency conversion of base band and RF signals. In a transmitter, the frequency synthesizer is often designed to handle low spurious emissions for spectral mask containment and also to maintain proper symbol construction to reduce the error vector magnitude (EVM). For receivers, frequency synthesizers should also exhibit low spurious generation to down convert the desired signal avoiding effects such as reciprocal mixing and to maintain an acceptable signal to noise ratio. Low spurious outputs are also important in carrier and data recovery circuits in which the signal to noise ratio of the recovered carrier is important. Embodiments described herein pertain to a method of controlling spurious outputs in a DPLL.

DETAILED DESCRIPTION

Embodiments relate to systems, devices, apparatus, assemblies, methods, and computer readable media to enhance wireless communications, and radar systems, and particularly to radio frequency synthesizers and digital phase locked loops (DPLLs) operating within those systems. The following description and the drawings illustrate specific embodiments to enable those skilled in the art to practice them. Other embodiments can incorporate structural, logical, electrical, process, and other changes. Portions and features of some embodiments can be included in, or substituted for, those of other embodiments, and are intended to cover all available equivalents of the elements described.

A traditional phase locked loop (PLL) in its simplest form consists of three elements: a phase detector, a loop filter, and a voltage controlled oscillator (VCO). The phase detector measures the phase error between a reference signal and the VCO output. The phase error (the phase detector output), which changes due to variation in the reference signal and due to noise, is smoothed out or averaged by the loop filter. The average phase error (the output of the loop filter) is used to steer the VCO in a negative feedback loop so as to drive the average phase error to zero or as close to zero as the particular PLL architecture is capable of. This is the locked condition of a PLL. One application of PLLs is to generate an oscillating signal that is proportional in frequency to some known stable reference. This is usually done with a frequency divider circuit in the feedback path from the VCO to the phase detector input. This allows frequency multiplication by an integer.

$$f_{VCO} = N \cdot f_{REF} \qquad [1]$$

One method to achieve greater frequency resolution is to implement a fractional frequency divider such that the VCO output frequency can be expressed as [2]

$$f_{VCO} = \left(P + \frac{N}{M}\right) \cdot f_{REF}.$$

Figure 1:
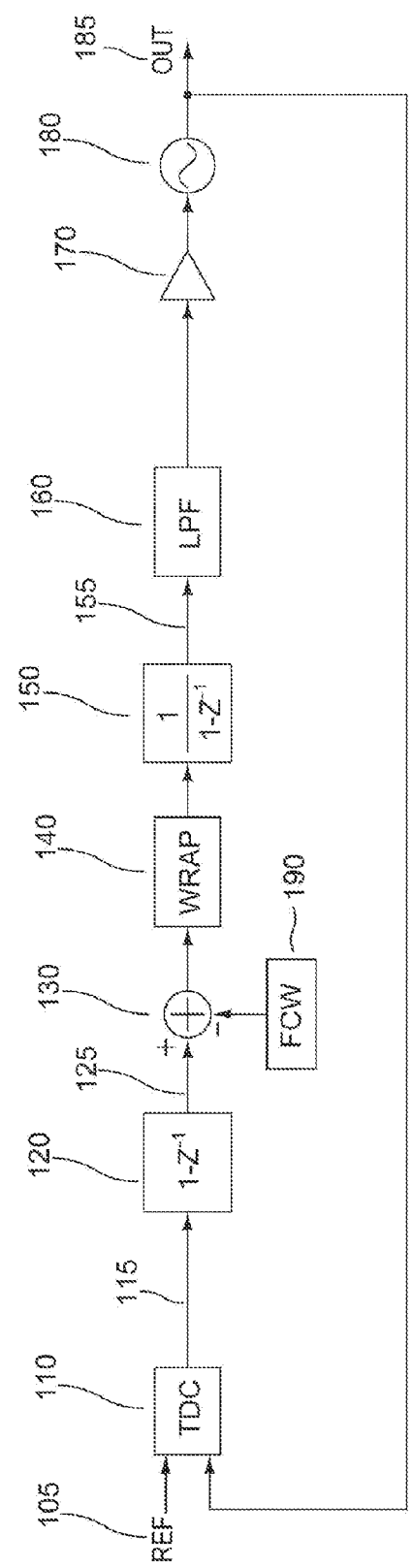
FIG. 1 is a drawing of a digital phase locked loop (DPLL) used for digital frequency synthesis, in accordance with some example embodiments.

FIG. 1 is a drawing of a digital phase locked loop (DPLL) used for digital frequency synthesis in accordance with some example embodiments. The operation of the DPLL is analogous to that described above. The reference signal 105 and the digitally controlled oscillator or voltage controlled oscillator (DCO/VCO) 180 output 185 are compared by the time to digital converter (TDC) 110. The TDC 110 measures the time between a rising edge of the reference signal 105 and a rising edge of the DCO/VCO 180 output 185 and produces a digital word representing the measured time difference 115, similar to a phase difference. In some other embodiments, both a falling edge to falling edge and a rising edge to rising edge are measured. This measured time (phase difference) is ultimately used to drive the scaler 170 and the DCO/VCO 180. The differentiator 120, the fractional code word (FCW) 190, the wrap around circuit 140, and the integrator 150 are added to the fractional frequency DPLL in order to bring the loop to be locked on the desired fractional code word (FCW). In some embodiments, an apparatus comprising scaler 170, wrap around circuit 140, and FCW 190 is referred to as a digital phase detector (DPD). In various embodiments, the integer frequency is tuned by adding a constant digital word to the digital lowpass filter output (e.g. a different word for each integer). The measured time is digitally differentiated by the differentiator 120 to produce a rate of change 125 similar to a time derivative of the phase difference that represent a frequency difference. The FCW 190 is subtracted by the adder 130 from the frequency difference which is the injected frequency offset described above, and the output of the adder 130 is wrapped around by the wrap around circuit 140. The wrap around circuit 140 wraps a digital word that overflows past one cycle back to the operating range between zero and one. The output of the wrap around circuit 140 (the frequency difference) is integrated by the integrator 150, returning back a time difference or phase error 155 that has now been adjusted by the injected frequency offset. The digital low pass filter (LPF) 160 smooths out abrupt transitions in the phase error 155. This is scaled by the scaler 170 and used to drive the VCO/DCO 180 creating the output 185. In the locked condition, the loop drives the phase error 155 (adjusted by the fractional frequency offset) to zero.

Figure 2:
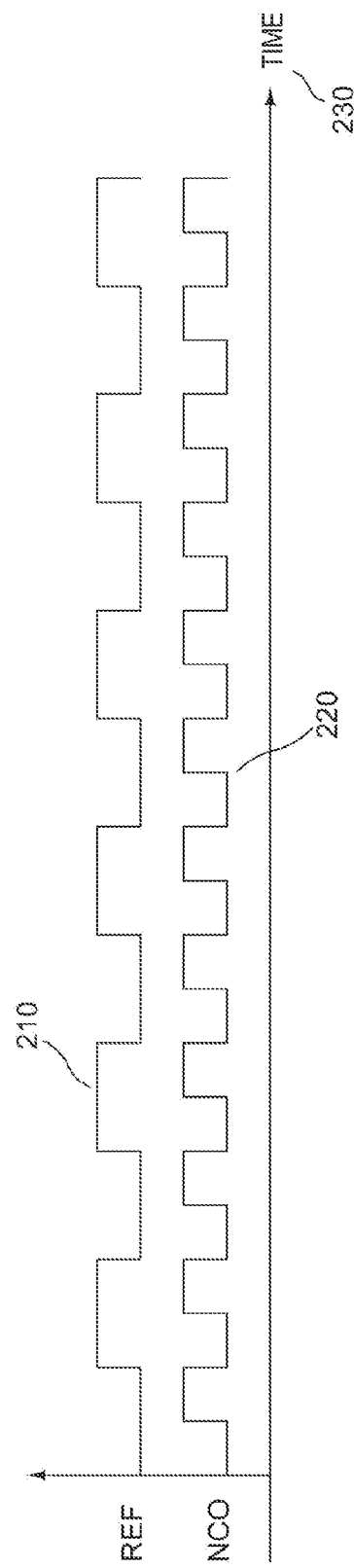
FIG. 2 illustrates a reference waveform and a clock generated waveform which is locked to an integer multiple (two) of the reference waveform, in accordance with some example embodiments.

FIG. 2 illustrates a reference waveform and a clock generated waveform which is locked to an integer multiple (two) of the reference waveform, in accordance with some example embodiments. FIG. 2 shows a reference signal 210 being frequency multiplied by two to create a synthesized signal 220 versus time 230. In some embodiments, this is accomplished by the DPLL of FIG. 1, where the FCW 190 is zero or 1.

Figure 3:
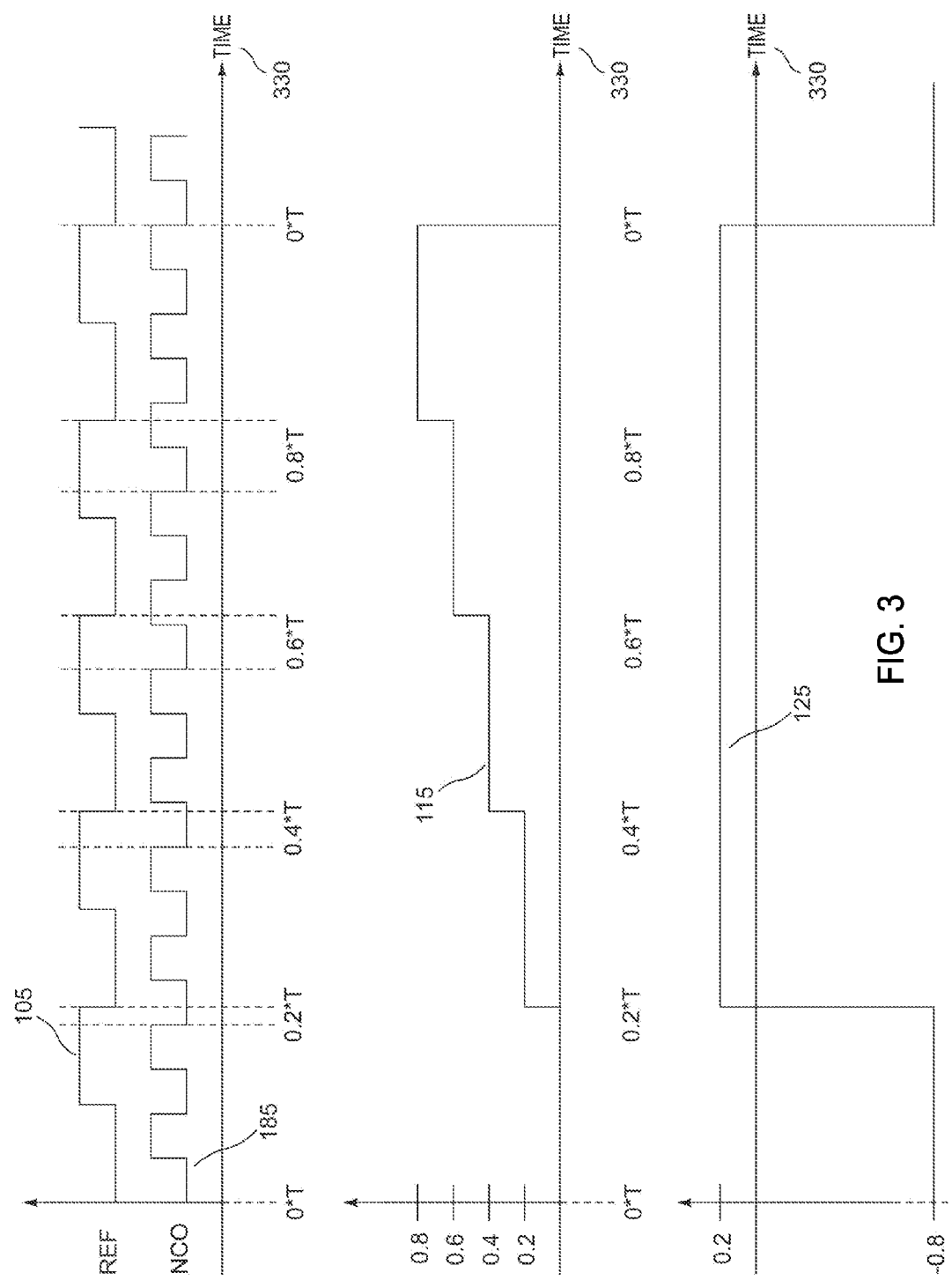
FIG. 3 illustrates an output waveform of a time to digital converter (TDC) and the frequency error, in accordance with some example embodiments.

FIG. 3 illustrates the output waveform of the time to digital converter (TDC) and the frequency error in accordance with some example embodiments. FIG. 3 shows a case where a reference signal 105 plotted against time 330 is being used to synthesize an DCO/VCO output 185 oscillating at 2.2 times the reference frequency. Assume here that the DPLL is operating in the locked condition. From FIG. 2, it can be seen that on each cycle of the reference signal 105, the DCO/VCO output 185 is advancing two tenths of a period T. The TDC 110 output is measuring the time difference 115 from the falling edge of the DCO/VCO output 185 to the next falling edge of the reference signal 105. Since the measured time difference 115 is increasing at a constant rate (0.T, 0.2T, 0.4T etc.), the output of the TDC 110 ramps up with a constant slope. Differentiating the accumulating phase through the differentiator 120 gives a constant rate of change 125 of phase or a constant frequency offset of 0.2. Each time the DPLL slips a full cycle the accumulated time difference 115 flips back to zero and the frequency offset is temporarily altered to −0.8. Note here that the phase difference of −0.8 cycles and 0.2 cycles are effectively the same. The FCW 190 is set to 0.2 and so the output of the adder 130 providing the frequency error is zero or negative one. The wrap around circuit 140 wraps the negative one into a zero. Therefore, the frequency error at the output of the wrap around circuit 140 is zero. The frequency error is integrated to obtain the phase error 155, which on average will also be zero since the DPLL is locked.

FIG. 1 and FIG. 3 show how the DPLL can work to synthesize a fractional frequency of the reference signal. In the example, the DCO/VCO 180 is initially set to 2× the reference signal 105 with an FCW 190 of 0.2 (0.2 relative to the period of the DCO/VCO 180). When the DPLL locks, a multiplication of 2.2 is achieved. The TDC 110 can be implemented from falling edge to falling edge, rising edge to rising edge, or any other permutation. Essentially, the measured time difference or phase error is differentiated to produce a fractional frequency difference. The FCW 190 allows the DPLL to inject a fractional frequency offset forcing the DPLL to lock to a fractional multiple of the reference. The frequency difference is integrated back to a phase difference or a phase error by the digital integrator 150 and the remaining elements in the DPLL operate as described for a normal phase locked loop.

In another embodiment, the integrator 150 can be implemented instead into each of the paths before the adder 130. In this case, one integrator would exist between the differentiator 120 and the adder 130, and one integrator would exist between the FCW 190 and the adder 130. The first integrator between the differentiator 120 and the adder 130 would cancel with the differentiator 120. Instead of differentiating the measured time difference 115 into a frequency error, the frequency offset can be integrated to provide an accumulating phase offset. The accumulating phase offset can be added to the measured time difference 115 and wrapped by the wrap around circuit 140 to produce the phase error 155.

One of the major performance metrics for synthesizers is the spurious response (spur), usually measured in decibels relative to the synthesized frequency (dBc). Spurs may be generated in a synthesizer by a divider circuit or a fractional divider circuit. They are also generated in the voltage controlled oscillator or digital controlled oscillator, and the phase detector or TDC. They can also be caused by input spurs already on the reference signal (reference spurs), and they can be injected from the power supply (power supply spurs). These are more common when the electronic device employs a DC to DC converter which uses a switcher that often produces spurs on the power supply lines. Often spurs are created by some mechanism in the PLL which causes a slight over correction or under correction occurring in a periodic fashion. With digital systems and DPLLs, spurs are also caused by quantization effects and round off errors.

Various methods already exist for mitigating spurs, such as increasing the resolution of the devices or adding dithering signals to break up the periodicity. However, increasing the resolution of digital devices uses more power and chip area and does not always affect the spur. The dithering technique is only applicable in certain situations and quite often does not reduce the spur either. Further, dithering is effectively injecting pseudorandom noise into the loop to break up the periodicity, and consequently any spur reduction comes at the price of increasing the noise floor. Other attempts have included notch filters in the transmit or receive chain, which are difficult to implement requiring a high degree of selectivity. Moreover, the notch filters are not very easily tuned to different frequencies, which is needed if the operating conditions of the synthesizer change. In the embodiments below, an inverse spur is created with the same magnitude, phase, and frequency as an undesired spur which exists in the digital phase locked loop. If the inverse spur has the correct magnitude, frequency, and phase, then when it is injected into the loop, the undesired spur is cancelled.

Suppose a DPLL has an unacceptably high spurious response. Let an undesired spur have the form:

$$x_{spur}(n) = g(n) \cdot \sin\left(2 \cdot \pi \cdot \frac{f}{f_{samp}} \cdot n + \phi(n)\right) \quad [3]$$

where $g(n)$ and $\phi(n)$ are the magnitude and phase of the spur at the spur source. The goal is to generate an inverse spur of the form:

$$x_{inv}(n) = g_{est}(n) \cdot \sin\left(2 \cdot \pi \cdot \frac{f}{f_{samp}} \cdot n + \phi_{est}(n)\right) \quad [4]$$

where $g_{est}(n)$ is the estimated spur magnitude and $\phi_{est}(n)$ is the estimated spur phase plus 180 degrees. The normalized spur frequency is $$\frac{f}{f_{samp}}$$

where $f_{samp}$ is the sampling rate of the DPLL. Let TF1($n$) be the transfer function from the spur source to the phase error 155 $e(n)$ output and let TF2($n$) be the transfer function from the inverse spur generator to the phase error 155 $e(n)$ output. Then the error signal can be expressed as:

$$e(n) = e_{NO\_spur}(n) + TF1(n) * x_{spur}(n) + TF2(n) * x_{inv}(n) \quad [5]$$

where $e_{NO\_spur}(n)$ is the error that exists without the undesirable spur and without the injected inverse spur. This phase error $e_{NO\_spur}(n)$ always exists in PLLs due to a plurality of noise sources and variation of the reference input. There are numerous statistical methods to determine the magnitude estimate and the phase estimate that, when injected into the DPLL, will cancel the spur.

Figure 4:
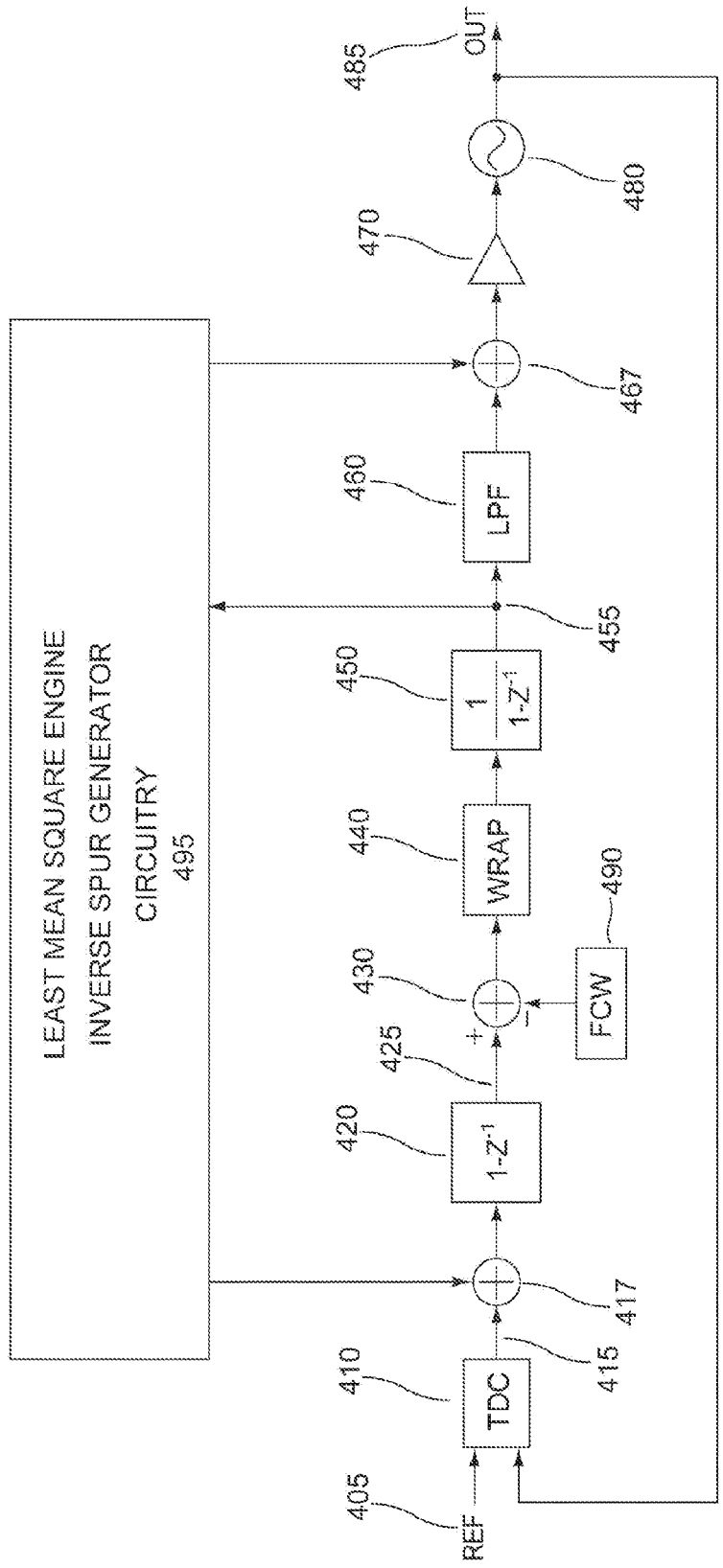
FIG. 4 is a drawing of a DPLL with spur detection and injection circuitry, in accordance with some example embodiments.

FIG. 4 is a drawing of a DPLL with spur detection and injection circuitry, in accordance with some example embodiments. FIG. 4 shows the DPLL with systems to cancel the undesirable spur. The basic operation of the DPLL is the same as described before with FIG. 1. The TDC 410 compares the reference signal 405 and the DCO/VCO 480 output 485 to generate the measured time difference 415. The measured time difference 415 is differentiated by the differentiator 420 generating a rate of change 425. A frequency offset or FCW 490 is subtracted by the adder 430 and the output is wrapped around by the wrap around circuit 440. Then the signal is integrated by the integrator 450 to generate the phase error or the error signal 455 $e(n)$. The error signal 455 is provided to the least mean square (LMS) engine 495 and low pass filtered by the LPF 460. The output of the LPF 460 is amplified by the scaler 470 to steer the DCO/VCO 480. The DCO/VCO 480 output 485 is fed back to the input of the TDC 410.

Two injection ports 417 and 467 are added to the system. Depending on the nature/source of the Spur, either one or the other of the ports 417 and 467 is used to inject the inverse spur. The LMS engine 495 is also added to estimate the needed magnitude and phase of the injected inverse spur. The LMS engine 495 also contains signal processing blocks to generate the inverse spur from the gain estimate and phase estimate. It is assumed that the frequency of the spur to be cancelled along with the transfer function from the source of the spur to the error signal 455 $e(n)$ is known.

In one embodiment, the gain estimate (or magnitude estimate) and phase estimate are found using LMS adaptation. This is accomplished by squaring the error signal 455 $e(n)$ and minimizing it. The squared error is:

$$e^2(n) = (e_{NOspur}(n) + TF1(n) * x_{spur}(n) + TF2(n) * x_{inv}(n))^2 \quad [6]$$

To minimize the squared error, the derivative of $e^2(n)$ with respect to the estimate of the gain coefficient and with respect to the estimate of the phase coefficient can be calculated as shown below.

$$\nabla J_{g_{est}} = \frac{d}{dg_{est}} e^2(n) = 2 \cdot e(n) \cdot \frac{de}{dg_{est}} = \quad [7]$$

$$2 \cdot e(n) \cdot \frac{d}{dg_{est}} TF2(n) * x_{inv}(n) = 2 \cdot e(n) \cdot TF2(n) * \frac{d}{dg_{est}} x_{inv}(n)$$

The derivative of $x_{inv}(n)$ with respect to $g_{est}$ is:

$$\frac{d}{dg_{est}} x_{inv}(n) = \sin\left(2 \cdot \pi \cdot \frac{f}{f_{samp}} \cdot n + \phi_{est}(n)\right) \quad [8]$$

Therefore, the gradient of the squared error with respect to the gain coefficient is:

$$\nabla J_{g_{est}} = 2 \cdot e(n) \cdot TF2(n) * \sin\left(2 \cdot \pi \cdot \frac{f}{f_{samp}} \cdot n + \phi_{est}(n)\right) \quad [9]$$

Here the current phase $\phi_{est}(n)$ can be estimated using the phase estimate of the previous sample, $\phi_{est}(n) \approx \phi_{est}(n-1)$.

$$\nabla J_{g_{est}} = 2 \cdot e(n) \cdot TF2(n) * \sin\left(2 \cdot \pi \cdot \frac{f}{f_{samp}} \cdot n + \phi_{est}(n-1)\right) \quad [10]$$

The gradient of the phase can also be found as:

$$\nabla J_{\phi_{est}} = \frac{d}{d\phi_{est}} e^2(n) = 2 \cdot e(n) \cdot \frac{de}{d\phi_{est}} = \quad [11]$$

$$2 \cdot e(n) \cdot \frac{d}{d\phi_{est}} TF2(n) * x_{inv}(n) = 2 \cdot e(n) \cdot TF2(n) * \frac{d}{d\phi_{est}} x_{inv}(n)$$

The derivative of $x_{inv}(n)$ with respect to $\phi_{est}$ is:

$$\frac{d}{d\phi_{est}} x_{inv}(n) = g_{est}(n) \cdot \cos\left(2 \cdot \pi \cdot \frac{f}{f_{samp}} \cdot n + \phi_{est}(n)\right) \quad [12]$$

where the derivative of the of the squared error with respect to $\phi_{est}$ is $$\nabla J_{\phi_{est}} = 2 \cdot e(n) \cdot TF2(n) * g_{est}(n) \cdot \cos\left(2 \cdot \pi \cdot \frac{f}{f_{samp}} \cdot n + \phi_{est}(n)\right) \quad [13]$$

Again the estimate of the gain coefficient, $g_{est}(n)$, and the estimate of the phase, $\phi_{est}(n)$, are substituted with estimates made during the previous sample.

$$\nabla J_{\phi_{est}} = 2 \cdot e(n) \cdot TF2(n) * g_{est}(n-1) \cdot \cos\left(2 \cdot \pi \cdot \frac{f}{f_{samp}} \cdot n + \phi_{est}(n-1)\right) \quad [14]$$

The update equations for the gain estimate and the phase estimate are $$g_{est}(n) = g_{est}(n-1) - \mu_g \cdot \nabla J_{g\_est} \quad [15]$$

$$\phi_{est}(n) = \phi_{est}(n-1) - \mu_\phi \cdot \nabla J_{\phi est} \quad [16]$$

where $\mu_g$ and $\mu_\phi$ are the step size for the gain estimate update and the phase estimate update respectively. The step size is chosen small enough to prevent the adaptation from becoming unstable and to provide a low steady state error, but large enough to achieve a reasonably fast adaptation time. When the gradient of the gain coefficient $\nabla J_{g_{est}}$ is positive, this indicates that increasing the gain coefficient will increase the squared error. Therefore, when the term $\mu_g \cdot \nabla J_{g_{est}}$ is subtracted from the previous gain estimate, the squared error will on average be reduced. Identical remarks apply for the phase update equation.

Figure 5:
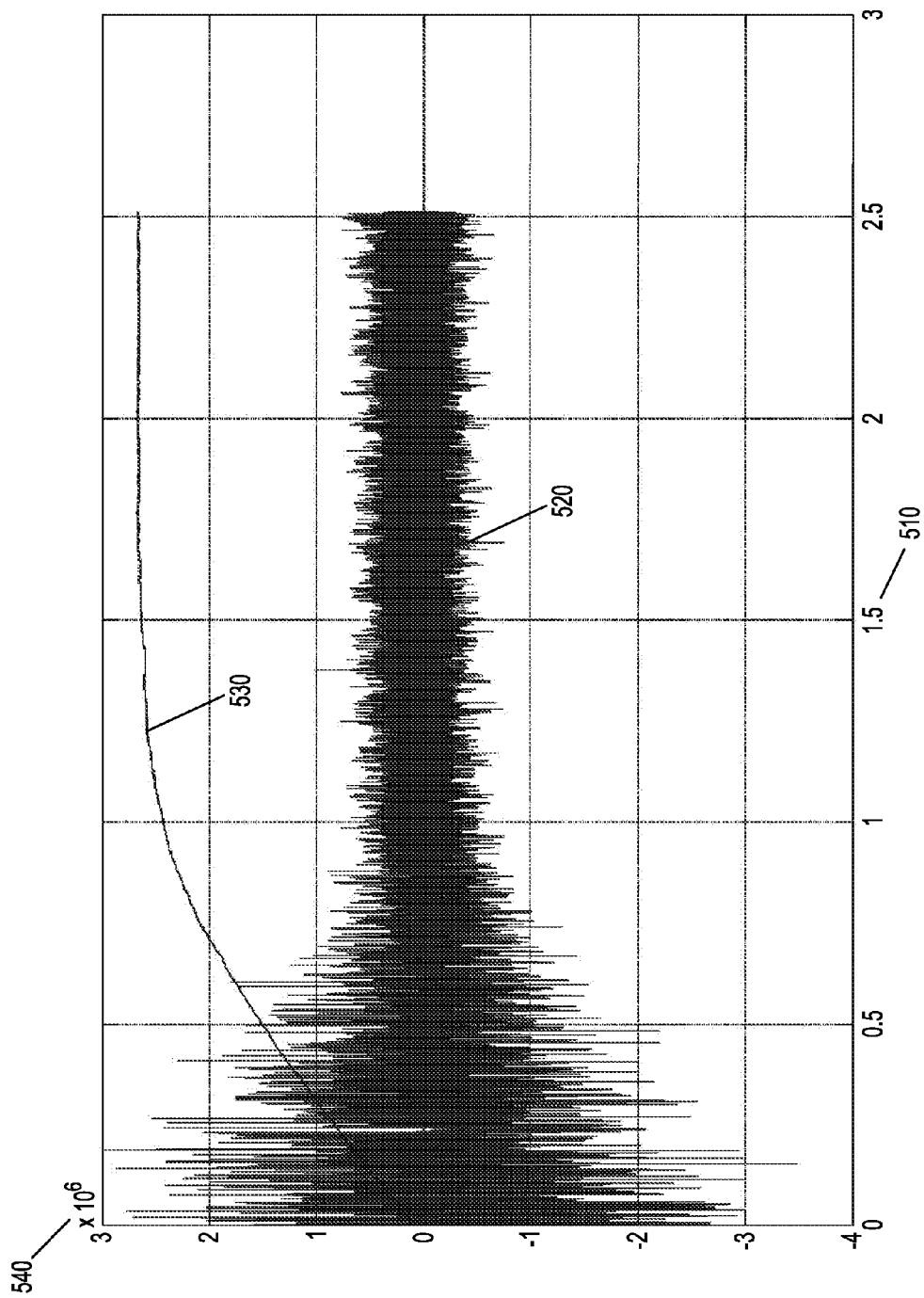
FIG. 5 is a plot of the phase error during least mean square (LMS) adaptation, in accordance with some example embodiments.
Figure 6:
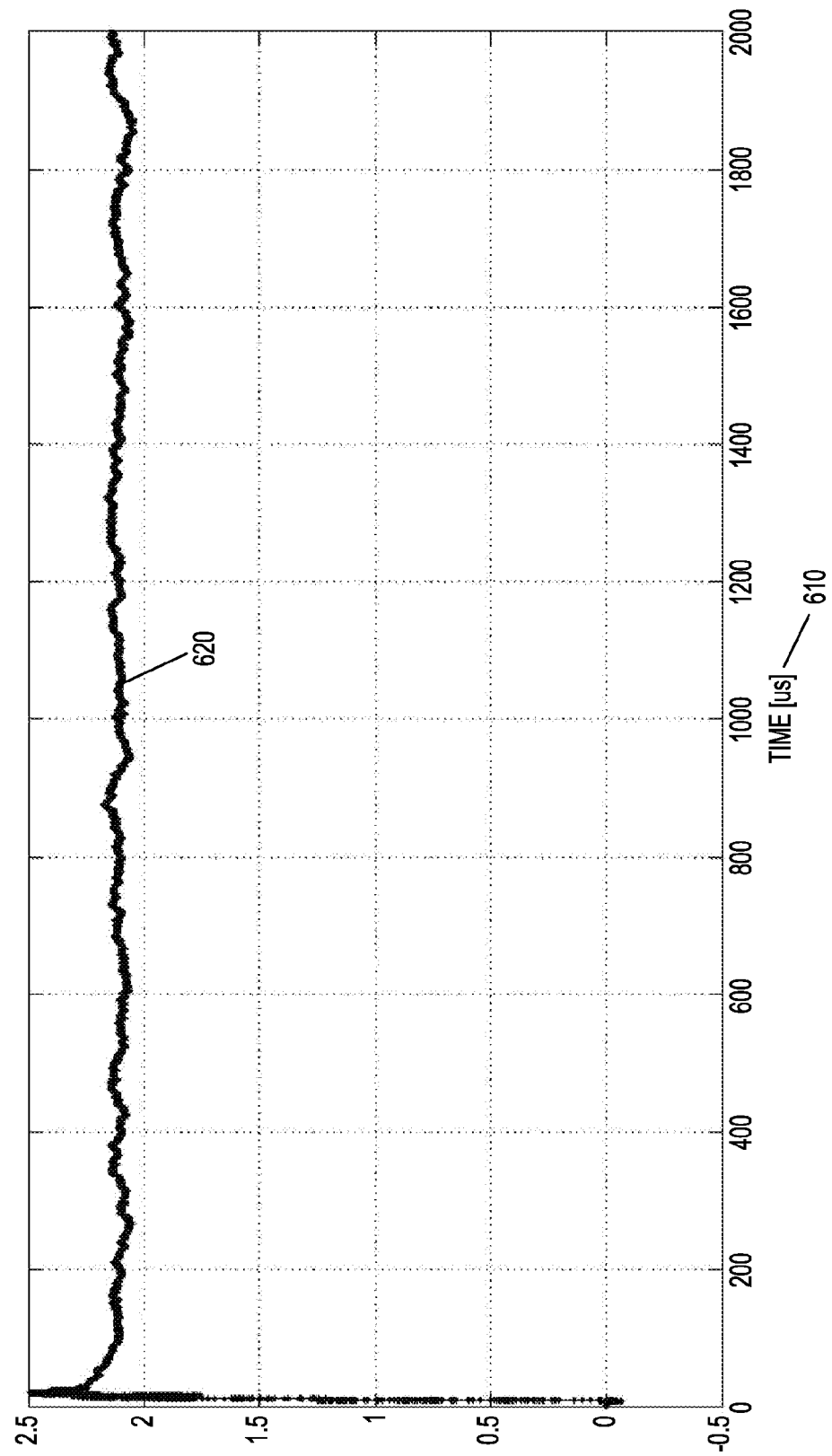
FIG. 6 is a plot of the phase estimate during LMS adaptation, in accordance with some example embodiments.
Figure 7:
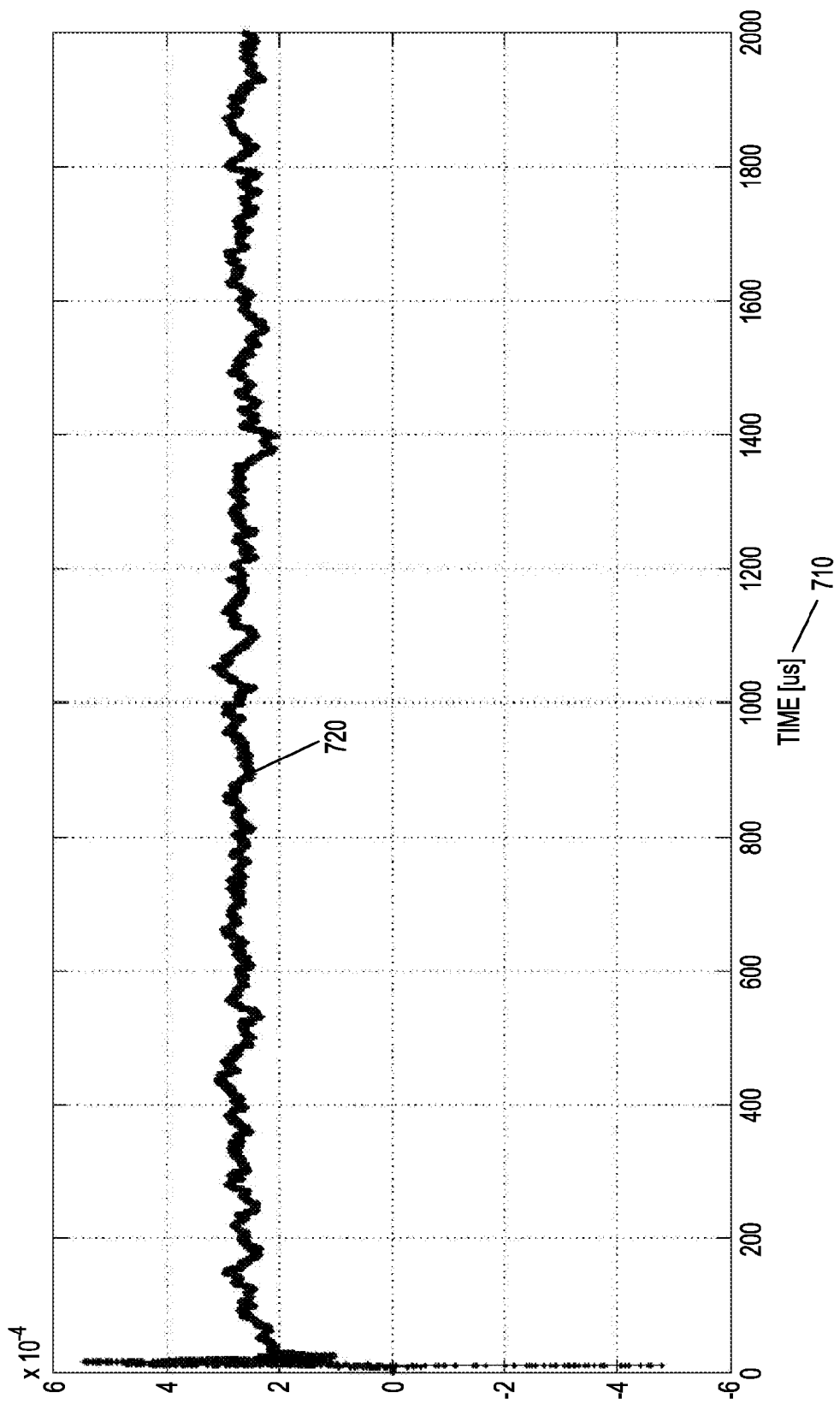
FIG. 7 is a plot of the gain estimate during LMS adaptation, in accordance with some example embodiments.

FIGS. 5, 6 and 7 show an example of an adaptation process. FIG. 5 is a plot of the phase error during LMS adaptation, in accordance with some example embodiments. In FIG. 5 the error signal e(n) 520 is plotted versus time 510. The LMS engine 495 measures the error signal and performs the calculations as described above to update the magnitude estimate (gain coefficient) and phase estimate of the inverse spur. The inverse spur is injected into the DPLL, reducing the undesired spur and reducing the mean squared error (MSE). Note that each LMS update does not necessarily improve the MSE. But the updates taken over time produce a reduced MSE. Also note that the LMS engine 495 can only reduce the error signal by cancelling signal energy that is correlated to the inverse spur, or specifically the inverse spur frequency. The remaining residual error is $e_{NO\_spur}(n)$, which always exists in PLLs, as discussed above. The gain coefficient 530 is also shown on the same plot. It can be seen that as the gain coefficient 530 exponentially settles to its final value, the error signal 520 is reduced.

FIG. 6 is a plot of the phase estimate during LMS adaptation, in accordance with some example embodiments. FIG. 6 shows the phase coefficient 620 versus time 610. Initially, the DPLL is unlocked. After locking to the reference signal, the phase estimate quickly adapts and remains stable. Here it is also demonstrated that the DPLL can still lock even in the presence of a spur. This is needed since the spur cancellation will not work if the DPLL is unlocked. Note that the steady state variation of the phase coefficient 620 can be reduced by reducing the step size. Sometimes the step size is adjusted such that it is large to reduce the initial adaptation time and then it is switched to a smaller step size after the initial adaptation to keep the steady state variation low. This is a technique known as gear shifting.

FIG. 7 is a plot of the gain estimate during LMS adaptation, in accordance with some example embodiments. FIG. 7 shows the gain coefficient 720 versus time 710. FIG. 7 also demonstrates adaptation while the DPLL locks and stabilizes in the presence of a spur.

Figure 8:
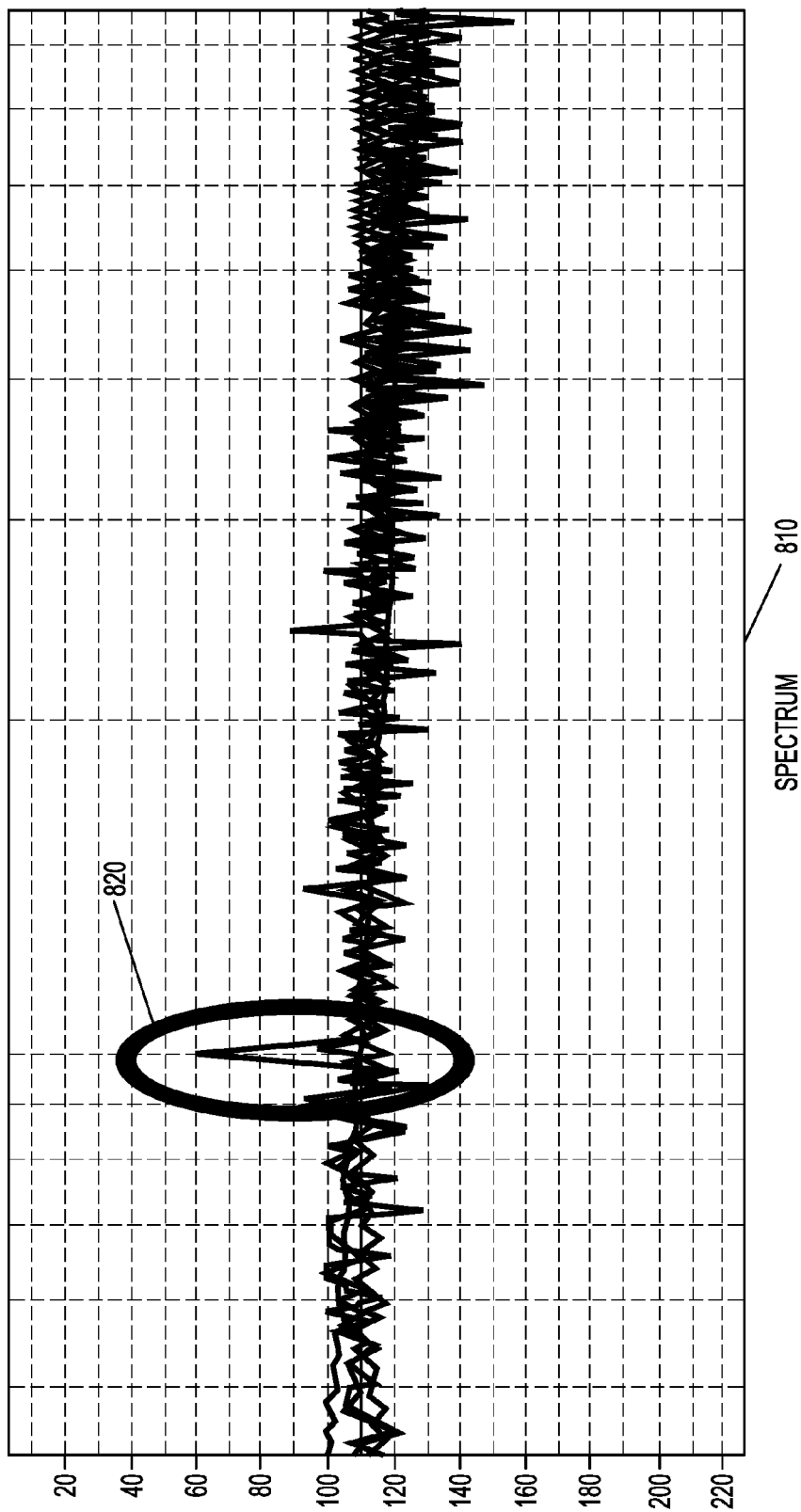
FIG. 8 is a plot of the spectral content before and after LMS adaptation, in accordance with some example embodiments.

FIG. 8 is a plot of the spectral content before and after LMS adaptation, in accordance with some example embodiments. FIG. 8 shows a plot of the DCO/VCO output spectrum without spur cancellation and then after LMS adaptation. The undesirable spur 820 is plotted against frequency axis 810 prior to LMS adaptation. In the modeled example implementation, only a single large deviation can be seen, and in the other waveforms after LMS adaptation the spur 820 is almost completely cancelled.

The spur can be injected at the input of the DCO/VCO or at the output of the TDC. A key difference between these injection points is that one is in front of the loop filter and the other is after the loop filter. The transfer function from each injection point to the error signal e(n) is different and the choice depends on the source of the spur. The injection point can be switchable depending on the conditions in real time.

In another embodiment, the spur cancellation method can be used to cancel multiple spurs. Here, there is a separate LMS engine and a separate inverse spur generator to create each inverse spur. Again, depending source of each spur, the corresponding inverse spur can be injected at the output of the TDC or the input of the DCO/VCO.

In other embodiments, the gain and phase coefficients can be determined with recursive least squares (RLS) or using a more direct approach such as straight matrix manipulation of a record of the error signal. With a record of the error signal and a known frequency, correct spur magnitude and phase can be determined to produce the minimum mean squared error using basic matrix manipulations.

The embodiments described can be used to generate a local oscillator (LO) frequency when up-converting transmit (TX) signals and when down-converting receive (RX) signals. In the case of TX signals, the spur reduction will improve the Error Vector Magnitude (EVM) as plotted on an In-Phase Quadrature-Phase constellation diagram. It will also provide for better spectral containment, which is usually required by Federal Communications Commission (FCC) regulations. For the case of RX signals, the spur reduction will improve the signal to noise ratio and the overall bit error rate of the system.

Figure 9:
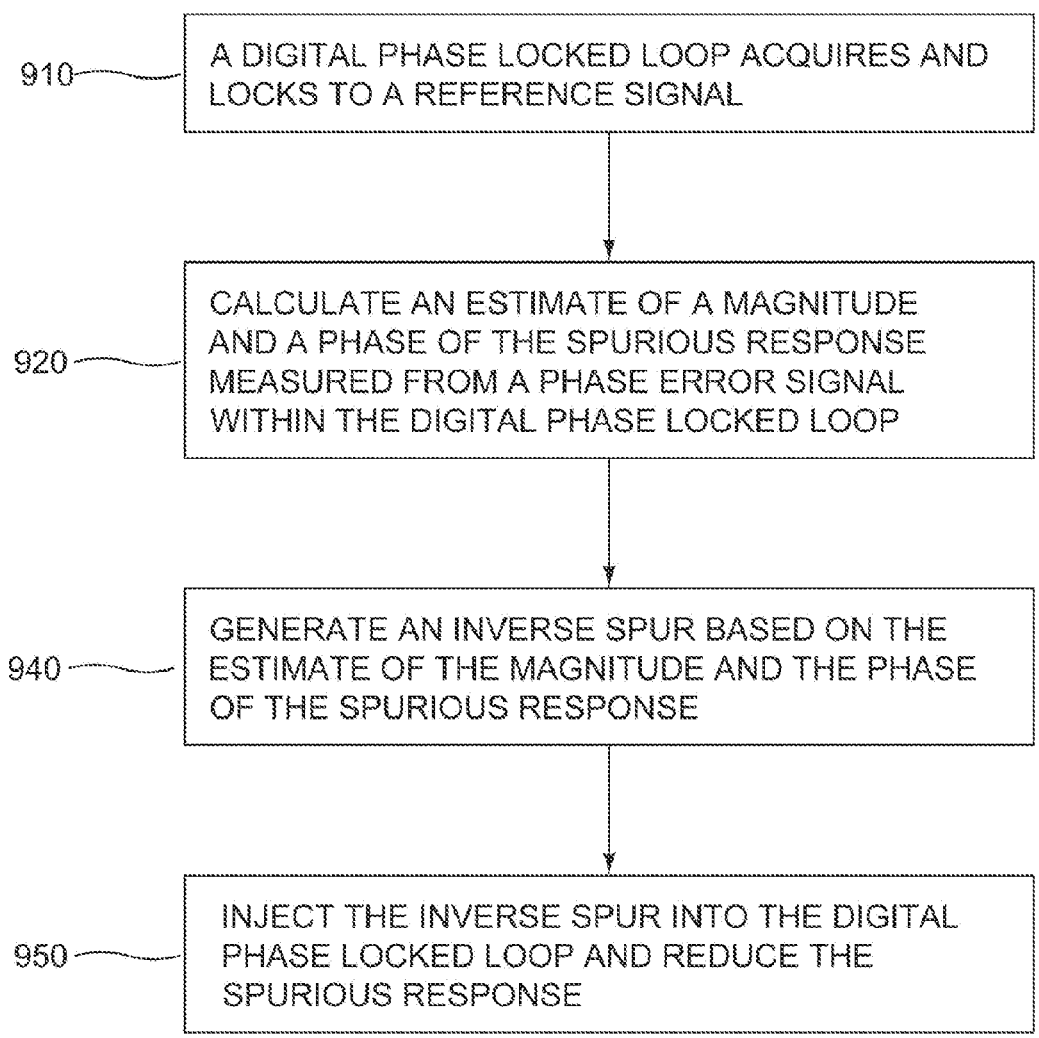
FIG. 9 illustrates the operational flow of a spur cancellation scheme, in accordance with some example embodiments.

FIG. 9 illustrates the operational flow of a spur cancellation scheme, in accordance with some example embodiments. In operation 910, the DPLL acquires and locks to the reference signal. This acquisition needs to occur despite the presence of the spurious response in order for the spur cancellation circuitry to operate. Next, in operation 920, the DPLL engages in a detection algorithm to estimate the magnitude and phase of a spur with known frequency. Any spurious response of the DPLL will show in the phase error signal, and this can be used to estimate the magnitude and the phase. In operation 940, an inverse spur is generated that matches the estimated magnitude and phase of the spur. The transfer functions TF1 and TF2 represent the magnitude and phase variation that the spur and the inverse spur undergo from the source to the phase detector output, respectively. The magnitude and phase of the generated inverse spur should also account for the transfer functions TF2($n$) so that when added, the inverse spur cancels with the unwanted spur. In operation 950, the inverse spur is injected into the DPLL in an injection port before the loop filter or an injection port after the loop filter. The point of injection will produce a response in the phase error signal which depends on and changes with the point of injection. The choice of which injection port can be made during actual operation with a switch so as to provide the best cancellation with the spur. The choice will largely depend on the source of the spur (e.g. VCO Spurs, TDC Spurs, REF Spurs, etc.).

In the above operational flow, the detection algorithm was not specified. However, in some embodiments, an LMS approach or an RLS approach is used. Here, the calculated estimate is iteratively adjusted based on the changes that occur in the error signal with each iteration. That is to say, operation 920 (calculate new estimate of magnitude and phase), operation 940 (generate new inverse spur based on new estimates), and operation 950 (inject inverse spur into the DPLL) are repeated over and over. On each iteration, the new phase error signal is measured where the spurious response has changed. The loop continues to repeat operations 920, 940, and 950 so as to reduce the total squared error on each iteration. By reducing the total squared error, the cancellation of spur energy is improved.

EXAMPLES

In various embodiments, methods, apparatus, non-transitory media, computer program products, or other implementations may be presented as example embodiments in accordance with the descriptions provided above. Certain embodiments may include UE such as phones, tablets, mobile computers, or other such devices. Some embodiments may be integrated circuit components of such devices. In various other devices, various combinations of hardware circuitry, firmware, and software are used to implement the spur cancellation as described herein. In some embodiments, functionality may be on a single chip or multiple chips in an apparatus.

Example 1 is an electronic device comprising: a digital phase locked loop; detection circuitry configured to calculate an estimate of a magnitude and an estimate of a phase of a spurious response of the digital phase locked loop; generation circuitry to generate an inverse spur based on the estimate of the magnitude and the estimate of the phase; and injection circuitry to inject the inverse spur into the digital phase locked loop such that the spurious response is reduced.

In Example 2, the subject matter of Example 1 optionally includes wherein the detection circuitry to calculate the estimate of the magnitude and the phase is configured to use a least mean squares (LMS) algorithm.

In Example 3, the subject matter of Example 2 optionally includes wherein the detection circuitry is further configured to calculate a derivative of a squared error with respect to the magnitude of the spurious response and a derivative of the squared error with respect to the phase of the spurious response, and the detection circuitry is further configured to adjust the estimate of the magnitude and the estimate of the phase in incremental steps to reduce the squared error.

In Example 4, the subject matter of any one or more of Examples 1-3 optionally include wherein the detection circuitry is configured to calculate the estimate of the magnitude according to equation 10 above wherein: E(N) is an error signal; TF1(N) is a transfer function from the source of the spurious response to the error signal; f is a frequency of the spurious response; f_samp is a sampling frequency of the digital phase locked loop; $\phi$_est (n−1) is a previous estimate of the phase as computed by a least mean squares engine; and n is a sample number of the digital phase locked loop.

In Example 5, the subject matter of any one or more of Examples 1-4 optionally include wherein the detection circuitry is configured to calculate and the estimate of the phase according to equation 14 above wherein: E(N) is an error signal; TF1(N) is a transfer function from the source of the spurious response to the error signal; f is a frequency of the spurious response; f_samp is a sampling frequency of the digital phase locked loop; G_EST (N−1) is a previous estimate of the phase as computed by a least mean squares engine; $\phi$_est (n−1) is a previous estimate of the phase as computed by a least mean squares engine; and n is a sample number of the digital phase locked loop.

In Example 6, the subject matter of any one or more of Examples 1-5 optionally include wherein the detection circuitry is configured to measure the spurious response from an error signal connected to an output of a time to digital converter.

In Example 7, the subject matter of any one or more of Examples 1-6 optionally include wherein the detection circuitry is configured to measure the spurious response from an error signal connected to an output of a phase detector.

In Example 8, the subject matter of any one or more of Examples 1-7 optionally include wherein the detection circuitry is configured to measure the spurious response from an output of the digital phase locked loop.

In Example 9, the subject matter of any one or more of Examples 1-8 optionally include wherein the injection circuitry is configured to switch between a first injection port and a second injection port wherein; the first injection port is located between a loop filter and a numerically controlled oscillator; and the second injection port is located between a time to digital converter (TDC) and a loop filter.

In Example 10, the subject matter of any one or more of Examples 1-9 optionally include wherein the detection circuitry to calculate the estimate of the magnitude and the phase is configured to use a recursive least squares (RLS) algorithm.

In Example 11, the subject matter of any one or more of Examples 1-10 optionally include wherein: the spurious response is comprised of a plurality of spurs; the detection circuitry is configured to calculate an estimate of a magnitude and a phase of one or more spurs comprised within the plurality of spurs; the generation circuitry is configured to generate a plurality of inverse spurs; and the injection circuitry is configured to inject the plurality of inverse spurs into the digital phase locked loop.

In Example 12, the subject matter of any one or more of Examples 1-11 optionally include further comprising: a digital synthesizer implemented with the digital phase locked loop; and an output of the digital synthesizer connected to an up-conversion mixer in a transmit chain of a wireless communication device.

In Example 13, the subject matter of any one or more of Examples 1-12 optionally include further comprising: a digital synthesizer implemented with the digital phase locked loop; and an output of the digital synthesizer connected to a down-conversion mixer in a receive chain of a wireless communication device.

In Example 14, the subject matter of any one or more of Examples 1-13 optionally include further comprising: a digital synthesizer implemented with the digital phase locked loop; and an output of the digital synthesizer used for frequency conversion in a radar system.

In Example 15, the subject matter of any one or more of Examples 12-14 optionally include wherein the injection of the inverse spur into the digital phase locked loop causes the wireless communication device to comply with a Federal Communications Commission (FCC) spectral mask requirement.

In Example 16, the subject matter of any one or more of Examples 12-15 optionally include wherein the injection of the inverse spur into the digital phase locked loop causes the wireless communication device to comply with error vector magnitude requirements for a transmit signal.

In Example 17, the subject matter of any one or more of Examples 13-16 optionally include wherein the injection of the inverse spur into the digital phase locked loop causes the wireless communication device to achieve performance requirements for a bit error rate (BER) when receiving data.

Example 18 is a non-transitory computer-readable medium comprising instructions that, when executed by one or more processors of a device, cause a digital phase locked loop (DPLL) to: lock to a reference signal; measure an error signal within the DPLL; calculate an estimate of a magnitude and an estimate of a phase of a spurious response measured from an error signal within the digital phase locked loop; generate an inverse spur based on the estimate of the magnitude and the estimate of the phase of the spurious response; and inject the inverse spur into the digital phase locked loop.

In Example 19, the subject matter of Example 18 optionally includes wherein the instructions further cause the digital phase locked loop to calculate an estimate of the magnitude and the estimate of the phase using a least mean squares (LMS) adaptation algorithm.

In Example 20, the subject matter of Example 19 optionally includes wherein the instructions further cause the digital phase locked loop to: calculate a derivative of a squared error with respect to the magnitude of the spurious response; calculate a derivative of the squared error with respect to the phase of the spurious response; and adjust the estimate of the magnitude and the estimate of the phase in incremental steps to reduce the squared error.

In Example 21, the subject matter of any one or more of Examples 18-20 optionally include wherein the instructions further cause the digital phase locked loop to measure the spurious response from the error signal connected to an output of a time to digital converter.

In Example 22, the subject matter of any one or more of Examples 18-21 optionally include wherein the instructions further cause the digital phase locked loop to measure the spurious response from the error signal connected to an output of a phase detector.

In Example 23, the subject matter of any one or more of Examples 18-22 optionally include wherein the instructions further cause the digital phase locked loop to measure the spurious response from the error signal connected to an output of the digital phase locked loop.

In Example 24, the subject matter of any one or more of Examples 18-23 optionally include wherein the instructions further cause the digital phase locked loop to switch between a first injection port and a second injection port wherein; the first injection port is located between a loop filter and a numerically controlled oscillator; and the second injection port is located between a time to digital converter (TDC) and a loop filter.

In Example 25, the subject matter of any one or more of Examples 18-24 optionally include wherein the instructions further cause the digital phase locked loop to calculate an estimate of the magnitude and the estimate of the phase using a recursive least squares (RLS) adaptation algorithm.

In Example 26, the subject matter of any one or more of Examples 18-25 optionally include wherein the instructions further cause the digital phase locked loop to: calculate an estimate of a magnitude and a phase of one or more spurs of a plurality of spurs measured from the error signal within the digital phase locked loop; generate a plurality of inverse spurs based on the estimate of the magnitude and the phase of one or more of the plurality of spurs; and inject the plurality of inverse spurs into the digital phase locked loop.

In Example 27, the subject matter of any one or more of Examples 18-26 optionally include wherein the instructions further cause the digital phase locked loop to function as a digital frequency synthesizer wherein the output of the digital synthesizer connected to an up-conversion mixer in a transmit chain of a wireless communication device.

In Example 28, the subject matter of any one or more of Examples 18-27 optionally include wherein the instructions further cause the digital phase locked loop to function as a digital frequency synthesizer wherein the output of the digital synthesizer connected to a down-conversion mixer in a receive chain of a wireless communication device.

Example 29 is a method performed by a digital phase locked loop (DPLL) for cancelling a spurious response of the phase locked loop, the method comprising: locking the DPLL to a reference signal; measuring an error signal within the DPLL; calculating an estimate of a magnitude and a phase of the spurious response of the digital phase locked loop; generating an inverse spur based on the estimate of the magnitude and the phase; and injecting the inverse spur into the digital phase locked loop such that the spurious response is reduced.

In Example 30, the subject matter of Example 29 optionally includes wherein the estimate of the magnitude and the phase is calculated to using a least mean squares (LMS) algorithm.

In Example 31, the subject matter of Example 30 optionally includes wherein: a derivative of a squared error with respect to the magnitude of the spurious response is calculated; a derivative of the squared error with respect to the phase of the spurious response is calculated; and the estimate of the magnitude and the estimate of the phase is adjusted in incremental steps so as to reduce the squared error.

In Example 32, the subject matter of any one or more of Examples 29-31 optionally include wherein the spurious response is measured from an error signal connected to an output of a time to digital converter.

In Example 33, the subject matter of any one or more of Examples 29-32 optionally include wherein the spurious response is measured from an error signal connected to an output of a phase detector.

In Example 34, the subject matter of any one or more of Examples 29-33 optionally include wherein the spurious response is measured from an output of the digital phase locked loop.

In Example 35, the subject matter of any one or more of Examples 29-34 optionally include further comprising: selecting between a first injection port and a second injection port wherein; the first injection port is located between a loop filter and a numerically controlled oscillator; and the second injection port is located between a time to digital converter (TDC) and a loop filter.

In Example 36, the subject matter of any one or more of Examples 29-35 optionally include wherein the estimate of the magnitude and the phase is calculated to using a recursive least squares (RLS) algorithm.

In Example 37, the subject matter of any one or more of Examples 29-36 optionally include further comprising: calculating an estimate of a magnitude and an estimate of a phase of one or more spurs of a plurality of spurs comprised within the spurious response of the digital phase locked loop; generating a plurality of inverse spurs based on the estimate of the magnitude and the estimate of the phase; and injecting the plurality of inverse spurs into the digital phase locked loop.

In Example 38, the subject matter of any one or more of Examples 29-37 optionally include wherein the digital phase locked loop is used to implement a digital synthesizer which drives an up-conversion mixer in a transmit chain.

In Example 39, the subject matter of any one or more of Examples 29-38 optionally include wherein the digital phase locked loop is used to implement a digital synthesizer which drives a down-conversion mixer in a receive chain.

Example 40 is a digital phase locked loop apparatus comprising: means for locking the DPLL to a reference signal; means for measuring an error signal within the DPLL; means for calculating an estimate of a magnitude and an estimate of a phase of a spurious response of the digital phase locked loop; means for generating an inverse spur based on the estimate of the magnitude and the estimate of the phase; and means for injecting the inverse spur into the digital phase locked loop such that the spurious response is reduced.

In Example 41, the subject matter of Example 40 optionally includes further comprising means for estimating the magnitude and the phase of the spurious response using a least mean squares (LMS) algorithm.

In Example 42, the subject matter of any one or more of Examples 40-41 optionally include further comprising: means for calculating a derivative of a squared error with respect to the magnitude of the spurious response; means for calculating a derivative of the squared error with respect to the phase of the spurious response; and means for adjusting the estimate of the magnitude and the estimate of the phase in incremental steps to reduce the squared error.

In Example 43, the subject matter of any one or more of Examples 40-42 optionally include further comprising means for measuring the spurious response from an output of a time to digital converter.

In Example 44, the subject matter of any one or more of Examples 40-43 optionally include further comprising means for measuring the spurious response from an error signal connected to an output of a phase detector.

In Example 45, the subject matter of any one or more of Examples 40-44 optionally include further comprising means for measuring the spurious response from an output of the digital phase locked loop.

In Example 46, the subject matter of any one or more of Examples 40-45 optionally include further comprising means to select between a first injection port and a second injection port wherein; the first injection port is located between a loop filter and a numerically controlled oscillator; and the second injection port is located between a time to digital converter (TDC) and a loop filter.

In Example 47, the subject matter of any one or more of Examples 40-46 optionally include further comprising means for estimating the magnitude and the phase of the spurious response using a recursive least squares (RLS) algorithm.

In Example 48, the subject matter of any one or more of Examples 40-47 optionally include further comprising: means for calculating an estimate of a magnitude and an estimate of a phase of one or more spurs comprised within a plurality of spurs; means for generating a plurality of inverse spurs; means for injecting the plurality of inverse spurs into the digital phase locked loop such that the spurious response is reduced.

Example 49 is a digital phase locked loop (DPLL) apparatus comprising: a time to digital converter comprising circuitry configured to generate a measured time difference between a reference signal input and a feedback oscillating signal input; fractional frequency offset circuitry connected to an output of the time to digital converter, the fractional frequency offset circuitry configured to adjust the measured time difference by a frequency code word and produce a phase error output; a loop filter connected to an output of the fractional frequency offset circuitry and configured to generate a filtered phase error response from the phase error output, the filtered phase error response to control a DPLL acquisition and response characteristic; a numerically controlled oscillator connected to an output of the loop filter, the numerically controlled oscillator configured to generate the feedback oscillating signal input to the time to digital converter steered by the filtered phase error response; detection circuitry connected to the output of the fractional frequency offset circuitry and configured to: calculate a derivative of a squared error from the phase error output with respect to a magnitude of a spurious response; calculate a derivative of the squared error from the phase error output with respect to a phase of the spurious response; adjust an estimate of the magnitude based on the derivative of the squared error with respect to the magnitude of the spurious response; and adjust an estimate of the phase based on the derivative of the squared error with respect to the phase of the spurious response; a generator circuit configured to generate an inverse spur of a same frequency as the spurious response based on the estimate of the magnitude and the estimate of the phase; and an injection circuit configured to switch between a first injection port and a second injection port, the first injection port connected to the output of the time to digital converter and the second injection port connected to the output of the loop filter, and further configured to inject the inverse spur into the DPLL apparatus.

In Example 50, the subject matter of Example 49 optionally includes further comprising: a digital synthesizer implemented with the DPLL apparatus; and an output of the digital synthesizer connected to an up-conversion mixer in a transmit chain of a wireless communication device.

In Example 51, the subject matter of any one or more of Examples 49-50 optionally include further comprising: a digital synthesizer implemented with the DPLL apparatus; and an output of the digital synthesizer connected to a down-conversion mixer in a receive chain of a wireless communication device.

In Example 52, the subject matter of any one or more of Examples 49-51 optionally include further comprising: a digital synthesizer implemented with the DPLL apparatus; and an output of the digital synthesizer connected to a mixer for frequency conversion in a radar system.

In Example 53, the subject matter of any one or more of Examples 29-52 optionally includes the method of any of examples 29-52 implemented as computer readable media comprising instructions that, when executed by one or more processors of a device comprising a DPLL, cause the device to perform the method of examples 29-52 or any method described herein.

Example 54 is a digital phase locked loop (DPLL) apparatus comprising: a time to digital converter comprising circuitry configured to generate a measured time difference between a reference signal input and a feedback oscillating signal input; fractional frequency offset circuitry connected to an output of the time to digital converter, the digital phase detector (DPD) circuitry configured to adjust the measured time difference by a frequency code word and produce a phase error output; a loop filter connected to an output of the DPD circuitry and configured to generate a filtered phase error response from the phase error output, the filtered phase error response to control a DPLL acquisition and response characteristic; a digital/voltage controlled oscillator connected to an output of the loop filter, the digital/voltage controlled oscillator configured to generate the feedback oscillating signal input to the time to digital converter steered by the filtered phase error response; detection circuitry connected to the output of the DPD circuitry and configured to: calculate a derivative of a squared error from the phase error output with respect to a magnitude of a spurious response; calculate a derivative of the squared error from the phase error output with respect to a phase of the spurious response; adjust an estimate of the magnitude based on the derivative of the squared error with respect to the magnitude of the spurious response; and adjust an estimate of the phase based on the derivative of the squared error with respect to the phase of the spurious response.

In Example 55, the subject matter of Example 54 optionally includes further comprising: a generator circuit configured to generate an inverse spur of a same frequency as the spurious response based on the estimate of the magnitude and the estimate of the phase; an injection circuit configured to switch between a first injection port and a second injection port, the first injection port connected to the output of the time to digital converter and the second injection port connected to the output of the loop filter, and further configured to inject the inverse spur into the DPLL apparatus; a digital synthesizer implemented with the DPLL apparatus; and an output of the digital synthesizer connected to an up-conversion mixer in a transmit chain of a wireless communication device.

Example 56 is an apparatus of a wireless device, the apparatus comprising: a digital phase locked loop; detection circuitry configured to calculate an estimate of a magnitude and an estimate of a phase of a spurious response of the digital phase locked loop; generation circuitry to generate an inverse spur based on the estimate of the magnitude and the estimate of the phase; and injection circuitry to inject the inverse spur into the digital phase locked loop and reduce the spurious response.

In Example 57, the subject matter of Example 56 optionally includes wherein the detection circuitry to calculate the estimate of the magnitude and the phase is configured to use a least mean squares (LMS) algorithm.

In Example 58, the subject matter of Example 57 optionally includes wherein the detection circuitry is further configured to calculate a derivative of a squared error with respect to the magnitude of the spurious response and a derivative of the squared error with respect to the phase of the spurious response, and the detection circuitry is further configured to adjust the estimate of the magnitude and the estimate of the phase in incremental steps to reduce the squared error.

In Example 59, the subject matter of any one or more of Examples above optionally include wherein the detection circuitry is configured to measure the spurious response from an error signal connected to an output of a time to digital converter.

In Example 60, the subject matter of any one or more of Examples above optionally include wherein the detection circuitry is configured to measure the spurious response from an error signal connected to an output of a phase detector.

In Example 61, the subject matter of any one or more of Examples above optionally include wherein the detection circuitry is configured to measure the spurious response from an output of the digital phase locked loop.

In Example 62, the subject matter of any one or more of Examples above optionally include wherein the injection circuitry is configured to switch between a first injection port and a second injection port wherein: the first injection port is located between a loop filter and a digital/voltage controlled oscillator (DCO/VCO); and the second injection port is located between a time to digital converter (TDC) and a Digital Phase detector (DPD).

Further, in addition to the specific combinations of examples described above, any of the examples detailing further implementations of an element of an apparatus or medium may be applied to any other corresponding apparatus or medium, or may be implemented in conjunction with another apparatus or medium. Thus, each example above may be combined with each other example in various ways both as implementations in a system and as combinations of elements to generate an embodiment from the combination of each example or group of examples. For example, any embodiment above describing various elements may be implemented as circuitry with additional connected elements, and may be implemented multiple times and connected in various different ways within a single device or integrated circuit. Similarly, methods, apparatus examples, and computer readable medium examples may each have a corresponding example of the other type even if such examples for every embodiment are not specifically detailed.

Figure 10:
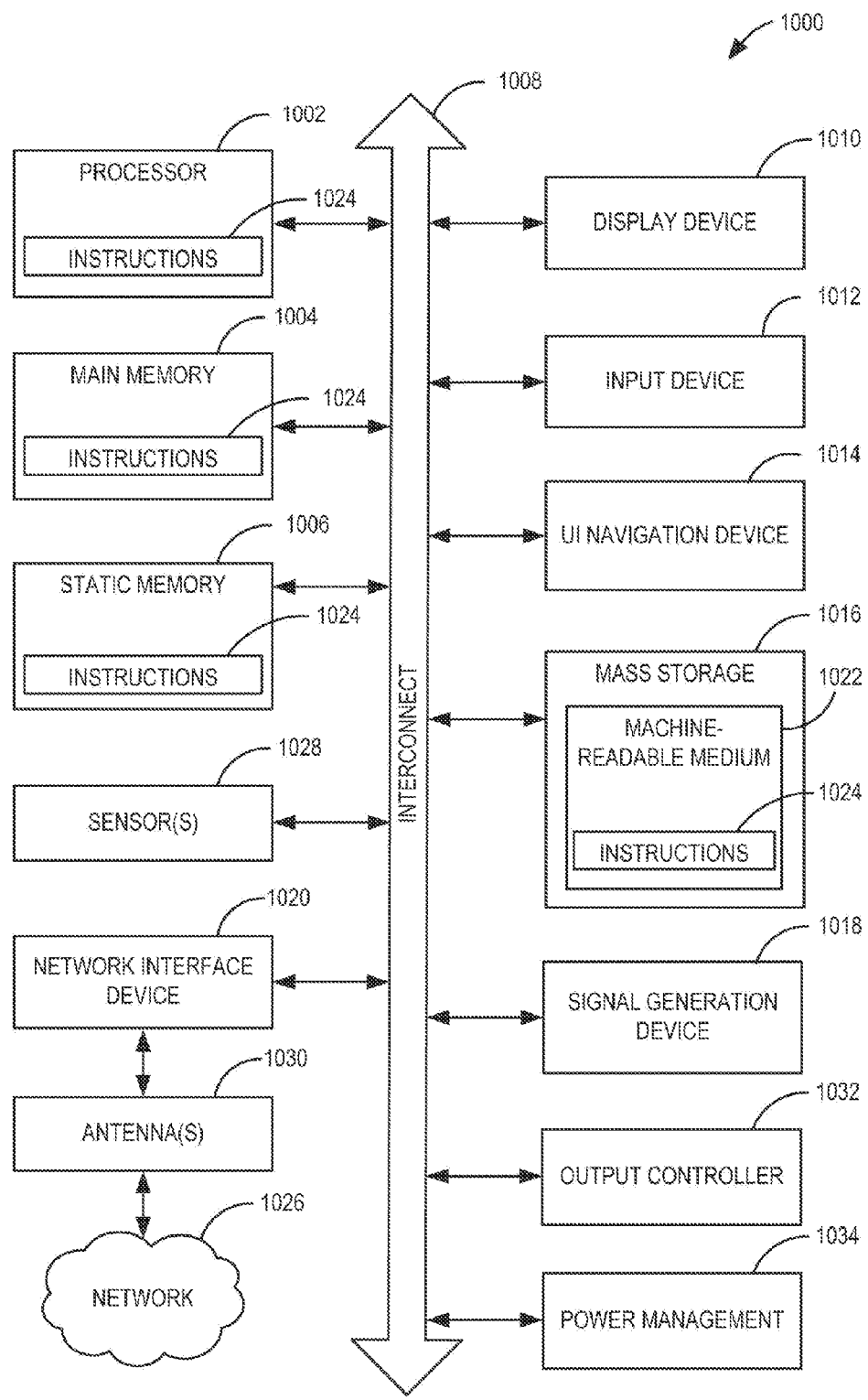
FIG. 10 is a block diagram illustrating an example computer system machine which may be used to implement various devices and methods described herein, in accordance with some embodiments.

FIG. 10 is a block diagram illustrating an example computer system machine 1000 which may be used to implement various devices and methods described herein, in accordance with some embodiments. The computer system machine 1000 or elements of the computer system machine 1000 may be used to implement any device, such as a mobile phone, tablet, laptop wireless access point, wireless station device, or any other such device described herein. In various other embodiments, different device components or multiples of any element may be used in different devices. Some embodiments may include other elements, such as digital synthesizers, digital phase locked loops, LMS engines, phase detectors, TDCs, numerically controlled oscillators, or other such elements integrated with any of the elements described herein for the computer system machine 1000. In various alternative embodiments, the machine operates as a standalone device or can be connected (e.g., networked) to other machines. In a networked deployment, the machine can operate in the capacity of either a server or a client machine in server-client network environments, or it can act as a peer machine in peer-to-peer (or distributed) network environments. The machine can be a personal computer (PC) that may or may not be portable (e.g., a notebook or a netbook), a tablet, a set-top box (STB), a gaming console, a Personal Digital Assistant (PDA), a mobile telephone or smartphone, a web appliance, a network router, switch, or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The example computer system machine 1000 includes a processor 1002 (e.g., a central processing unit (CPU), a graphics processing unit (GPU), or both), a main memory 1004, and a static memory 1006, which communicate with each other via an interconnect 1008 (e.g., a link, a bus, etc.). The computer system machine 1000 can further include a display device 1010, an alphanumeric input device 1012 (e.g., a keyboard), and a user interface (UI) navigation device 1014 (e.g., a mouse). In one embodiment, the display device 1010, input device 1012, and UI navigation device 1014 are a touch screen display. The computer system machine 1000 can additionally include a storage device 1016 (e.g., a drive unit), a signal generation device 1018

(e.g., a speaker), an output controller 1032, a power management controller 1034, a network interface device 1020 (which can include or operably communicate with one or more antennas 1030, transceivers, or other wireless communications hardware), and one or more sensors 1028, such as a Global Positioning System (GPS) sensor, compass, location sensor, accelerometer, or other sensor.

The storage device 1016 includes a machine-readable medium 1022 on which is stored one or more sets of data structures and instructions 1024 (e.g., software) embodying or utilized by any one or more of the methodologies or functions described herein. The instructions 1024 can also reside, completely or at least partially, within the main memory 1004, the static memory 1006, and/or the processor 1002 during execution thereof by the computer system machine 1000, with the main memory 1004, the static memory 1006, and the processor 1002 also constituting machine-readable media.

While the machine-readable medium 1022 is illustrated in an example embodiment to be a single medium, the term "machine-readable medium" can include a single medium or multiple media (e.g., a centralized or distributed database, and/or associated caches and servers) that store the one or more instructions 1024. The term "machine-readable medium" shall also be taken to include any tangible medium that is capable of storing, encoding, or carrying instructions for execution by the machine and that cause the machine to perform any one or more of the methodologies of the present disclosure, or that is capable of storing, encoding, or carrying data structures utilized by or associated with such instructions.

The instructions 1024 can further be transmitted or received over a communications network 1026 using a transmission medium via the network interface device 1020 utilizing any one of a number of well-known transfer protocols (e.g., hypertext transfer protocol (HTTP)). The term "transmission medium" shall be taken to include any intangible medium that is capable of storing, encoding, or carrying instructions for execution by the machine, and includes digital or analog communications signals or other intangible media to facilitate communication of such software.

Various techniques, or certain aspects or portions thereof, may take the form of program code (i.e., instructions) embodied in tangible media, such as floppy diskettes, CD-ROMs, hard drives, non-transitory computer readable storage media, or any other machine-readable storage medium wherein, when the program code is loaded into and executed by a machine, such as a computer, the machine becomes an apparatus for practicing the various techniques. In the case of program code execution on programmable computers, the computing device may include a processor, a storage medium readable by the processor (including volatile and non-volatile memory and/or storage elements), at least one input device, and at least one output device. The volatile and non-volatile memory and/or storage elements may be a random-access memory (RAM), electrically programmable read-only memory (EPROM), flash drive, optical drive, magnetic hard drive, or other medium for storing electronic data. The machine may also include a transceiver module, a counter module, a processing module, and/or a clock module or timer module. One or more programs that may implement or utilize the various techniques described herein may use an application programming interface (API), reusable controls, and the like. Such programs may be implemented in a high level procedural or object oriented programming language to communicate with a computer system. However, the program(s) may be implemented in assembly or machine language, if desired. In any case, the language may be a compiled or interpreted language, and combined with hardware implementations.

Various embodiments may use 3GPP LTE/LTE-A, IEEE 1002.11, and Bluetooth communication standards. Various alternative embodiments may use a variety of other wireless wide-area network (WWAN), wireless local area network (WLAN), and wireless personal area network (WPAN) protocols and standards in connection with the techniques described herein. These standards include, but are not limited to, other standards from 3GPP (e.g., HSPA+, UMTS), IEEE 1002.16 (e.g., 1002.16p), or Bluetooth (e.g., Bluetooth 9.0, or like standards defined by the Bluetooth Special Interest Group) standards families. Other applicable network configurations can be included within the scope of the presently described communication networks. It will be understood that communications on such communication networks can be facilitated using any number of personal area networks, LANs, and WANs, using any combination of wired or wireless transmission mediums.

The embodiments described above can be implemented in one or a combination of hardware, firmware, and software. Various methods or techniques, or certain aspects or portions thereof, can take the form of program code (i.e., instructions) embodied in tangible media, such as flash memory, hard drives, portable storage devices, read-only memory (ROM), RAM, semiconductor memory devices (e.g., EPROM, Electrically Erasable Programmable Read-Only Memory (EEPROM)), magnetic disk storage media, optical storage media, and any other machine-readable storage medium or storage device wherein, when the program code is loaded into and executed by a machine, such as a computer or networking device, the machine becomes an apparatus for practicing the various techniques.

A machine-readable storage medium or other storage device can include any non-transitory mechanism for storing information in a form readable by a machine (e.g., a computer). In the case of program code executing on programmable computers, the computing device can include a processor, a storage medium readable by the processor (including volatile and non-volatile memory and/or storage elements), at least one input device, and at least one output device. One or more programs that can implement or utilize the various techniques described herein can use an application programming interface (API), reusable controls, and the like. Such programs can be implemented in a high level procedural or object oriented programming language to communicate with a computer system. However, the program(s) can be implemented in assembly or machine language, if desired. In any case, the language can be a compiled or interpreted language, and combined with hardware implementations.

It should be understood that the functional units or capabilities described in this specification can have been referred to or labeled as components or modules, in order to more particularly emphasize their implementation independence. For example, a component or module can be implemented as a hardware circuit comprising custom very-large-scale integration (VLSI) circuits or gate arrays, off-the-shelf semiconductors such as logic chips, transistors, or other discrete components. A component or module can also be implemented in programmable hardware devices such as field programmable gate arrays, programmable array logic, programmable logic devices, or the like. Components or modules can also be implemented in software for execution by various types of processors. An identified component or module of executable code can, for instance, comprise one or more physical or logical blocks of computer instructions, which can, for instance, be organized as an object, procedure, or function. Nevertheless, the executables of an identified component or module need not be physically located together, but can comprise disparate instructions stored in different locations which, when joined logically together, comprise the component or module and achieve the stated purpose for the component or module.

Indeed, a component or module of executable code can be a single instruction, or many instructions, and can even be distributed over several different code segments, among different programs, and across several memory devices. Similarly, operational data can be identified and illustrated herein within components or modules, and can be embodied in any suitable form and organized within any suitable type of data structure. The operational data can be collected as a single data set, or can be distributed over different locations including over different storage devices, and can exist, at least partially, merely as electronic signals on a system or network. The components or modules can be passive or active, including agents operable to perform desired functions. Additional examples of the presently described method, system, and device embodiments include the following, non-limiting configurations. Each of the following non-limiting examples can stand on its own, or can be combined in any permutation or combination with any one or more of the other examples provided below or throughout the present disclosure.

What is claimed is:

1. An apparatus of a wireless device, the apparatus comprising:
   a digital phase locked loop;
   detection circuitry configured to calculate an estimate of a magnitude and an estimate of a phase of a spurious response of the digital phase locked loop;
   generation circuitry to generate an inverse spur based on the estimate of the magnitude and the estimate of the phase; and
   injection circuitry to inject the inverse spur into the digital phase locked loop and reduce the spurious response;
   wherein the detection circuitry is configured to calculate the estimate of the magnitude and the phase using a least mean squares (LMS) algorithm; and
   wherein the detection circuitry is further configured to calculate a derivative of a squared error with respect to the magnitude of the spurious response and a derivative of the squared error with respect to the phase of the spurious response, and the detection circuitry is further configured to adjust the estimate of the magnitude and the estimate of the phase in incremental steps to reduce the squared error.

2. The apparatus of claim 1 wherein the detection circuitry is configured to calculate the estimate of the magnitude according to:

$$\nabla J_{g_{est}} = 2 \cdot e(n) \cdot TF2(n) * \sin\left(2 \cdot \pi \cdot \frac{f}{f_{samp}} \cdot n + \phi_{est}(n)\right)$$

wherein:
   e(n) is an error signal;
   TF2($n$) is a transfer function from the source of the inverse spur to the error signal;
   f is a frequency of the spurious response;
   $f_{samp}$ is a sampling frequency of the digital phase locked loop;
   $\phi_{est}$(n-1) is a previous estimate of the phase as computed by a least mean squares engine; and
   n is a sample number of the digital phase locked loop.

3. The apparatus of claim 1 wherein the detection circuitry is configured to calculate the estimate of the phase according to:

$$\nabla J_{\phi_{est}} = 2 \cdot e(n) \cdot TF2(n) * g_{est}(n-1) \cdot \cos\left(2 \cdot \pi \cdot \frac{f}{f_{samp}} \cdot n + \phi_{est}(n-1)\right)$$

wherein:
   e(n) is an error signal;
   TF2($n$) is a transfer function from the source of the inverse spur to the error signal;
   f is a frequency of the spurious response;
   $f_{samp}$ is a sampling frequency of the digital phase locked loop;
   $g_{est}$(n-1) is a previous estimate of the gain coefficient as computed by a least mean squares engine;
   $\phi_{est}$(n-1) is a previous estimate of the phase as computed by a least mean squares engine; and
   n is a sample number of the digital phase locked loop.

4. The apparatus of claim 1 wherein the detection circuitry is configured to measure the spurious response from an error signal connected to an output of a time to digital converter.

5. The apparatus of claim 1 wherein the detection circuitry is configured to measure the spurious response from an error signal connected to an output of a phase detector.

6. The apparatus of claim 1 wherein the detection circuitry is configured to measure the spurious response from an output of the digital phase locked loop.

7. The apparatus of claim 1 wherein:
   the spurious response is comprised of a plurality of spurs;
   the detection circuitry is configured to calculate an estimate of a magnitude and a phase of one or more spurs comprised within the plurality of spurs;
   the generation circuitry is configured to generate a plurality of inverse spurs; and
   the injection circuitry is configured to inject the plurality of inverse spurs into the digital phase locked loop.

8. The apparatus of claim 1 further comprising:
   a digital synthesizer implemented with the digital phase locked loop; and
   an output of the digital synthesizer connected to an up-conversion mixer in a transmit chain of the wireless device.

9. The apparatus of claim 8 wherein the injection of the inverse spur into the digital phase locked loop causes the wireless device to comply with a Federal Communications Commission (FCC) spectral mask requirement.

10. The apparatus of claim 8 wherein the injection of the inverse spur into the digital phase locked loop causes the wireless device to comply with error vector magnitude requirements for a transmit signal.

11. The apparatus of claim 1 further comprising:
   a digital synthesizer implemented with the digital phase locked loop; and
   an output of the digital synthesizer connected to a down-conversion mixer in a receive chain of the wireless device.

12. The apparatus of claim 11 wherein the injection of the inverse spur into the digital phase locked loop causes the wireless device to achieve performance requirements for a bit error rate (BER) when receiving data.

13. The apparatus of claim 1 further comprising:
a digital synthesizer implemented with the digital phase locked loop; and
an output of the digital synthesizer used for frequency conversion in a radar system.

14. A non-transitory computer-readable medium comprising instructions that, when executed by one or more processors of a wireless device, cause a digital phase locked loop (DPLL) to:
lock to a reference signal;
measure an error signal within the DPLL;
calculate an estimate of a magnitude and an estimate of a phase of a spurious response measured from an error signal within the digital phase locked loop, wherein the estimate of the magnitude and the phase is calculated using a least mean squares (LMS) algorithm;
generate an inverse spur based on the estimate of the magnitude and the estimate of the phase of the spurious response;
inject the inverse spur into the digital phase locked loop;
calculate a derivative of a squared error with respect to the magnitude of the spurious response;
calculate a derivative of the squared error with respect to the phase of the spurious response; and
adjust the estimate of the magnitude and the estimate of the phase in incremental steps to reduce the squared error.

15. The non-transitory computer-readable medium of claim 14 wherein the instructions further cause the digital phase locked loop (DPLL) to:
select between a first injection port and a second injection port, wherein the first injection port is located between a loop filter and a digital voltage controlled oscillator and the second injection port is located between a time to digital converter (TDC) and a Digital Phase Detector.

16. The non-transitory computer-readable medium of claim 14 wherein the instructions further cause the digital phase locked loop (DPLL) to:
calculate an estimate of a magnitude and an estimate of a phase of one or more spurs of a plurality of spurs comprised within the spurious response of the digital phase locked loop;
generate a plurality of inverse spurs based on the estimate of the magnitude and the estimate of the phase; and
inject the plurality of inverse spurs into the digital phase locked loop.

17. The non-transitory computer-readable medium of claim 16 wherein the instructions further cause the digital phase locked loop (DPLL) to confirm that injection of the plurality of inverse spurs into the digital phase locked loop causes a wireless device to comply with error vector magnitude requirements for a transmit signal.

18. The non-transitory computer-readable medium of claim 16 wherein the instructions further cause the digital phase locked loop (DPLL) to confirm that injection of the plurality of inverse spurs into the digital phase locked loop causes a wireless device to achieve performance requirements for a bit error rate (BER) when receiving data.

19. A method performed by a digital phase locked loop (DPLL) for cancelling a spurious response of the phase locked loop, the method comprising:
locking the DPLL to a reference signal;
measuring an error signal within the DPLL;
calculating an estimate of a magnitude and a phase of the spurious response of the digital phase locked loop using a least mean squares (LMS) algorithm;
generating an inverse spur based on the estimate of the magnitude and the phase;
injecting the inverse spur into the digital phase locked loop to reduce spurious response;
calculating a derivative of a squared error with respect to the magnitude of the spurious response;
calculating a derivative of the squared error with respect to the phase of the spurious response; and
adjusting the estimate of the magnitude and the estimate of the phase in incremental steps to reduce the squared error.

20. The method of claim 19 further comprising:
selecting between a first injection port and a second injection port wherein;
the first injection port is located between a loop filter and a digital voltage controlled oscillator; and
the second injection port is located between a time to digital converter (TDC) and a Digital Phase Detector.

21. The method of claim 19 further comprising:
calculating an estimate of a magnitude and an estimate of a phase of one or more spurs of a plurality of spurs comprised within the spurious response of the digital phase locked loop;
generating a plurality of inverse spurs based on the estimate of the magnitude and the estimate of the phase; and
injecting the plurality of inverse spurs into the digital phase locked loop.

22. A digital phase locked loop (DPLL) apparatus comprising:
a time to digital converter comprising circuitry configured to generate a measured time difference between a reference signal input and a feedback oscillating signal input;
fractional frequency offset circuitry connected to an output of the time to digital converter, the digital phase detector (DPD) circuitry configured to adjust the measured time difference by a frequency code word and produce a phase error output;
a loop filter connected to an output of the DPD circuitry and configured to generate a filtered phase error response from the phase error output, the filtered phase error response to control a DPLL acquisition and response characteristic;
a digital/voltage controlled oscillator connected to an output of the loop filter, the digital/voltage controlled oscillator configured to generate the feedback oscillating signal input to the time to digital converter steered by the filtered phase error response;
detection circuitry connected to the output of the DPD circuitry and configured to:
calculate a derivative of a squared error from the phase error output with respect to a magnitude of a spurious response;
calculate a derivative of the squared error from the phase error output with respect to a phase of the spurious response;
adjust an estimate of the magnitude based on the derivative of the squared error with respect to the magnitude of the spurious response; and
adjust an estimate of the phase based on the derivative of the squared error with respect to the phase of the spurious response.

23. The apparatus of claim 22 further comprising:

a generator circuit configured to generate an inverse spur of a same frequency as the spurious response based on the estimate of the magnitude and the estimate of the phase;

an injection circuit configured to switch between a first injection port and a second injection port, the first injection port connected to the output of the time to digital converter and the second injection port connected to the output of the loop filter, and further configured to inject the inverse spur into the DPLL apparatus;

an output of the digital synthesizer connected to an up-conversion mixer in a transmit chain of a wireless communication device.

24. The apparatus of claim 23 wherein the detection circuitry is further configured to calculate an estimate of a magnitude and a phase of one or more spurs comprised within a plurality of spurs;

wherein the generator circuit is configured to generate a plurality of inverse spurs of a same frequency as the plurality of spurs; and wherein the injection circuit is configured to inject the plurality of inverse spurs into the DPLL apparatus.

25. The apparatus of claim 22 wherein the detection circuitry is further configured to calculate an estimate of a magnitude and a phase of one or more spurs comprised within a plurality of spurs;

generate a plurality of inverse spurs; and the injection circuitry is configured to inject the plurality of inverse spurs into the digital phase locked loop.

26. The apparatus of claim 25 wherein the injection of the plurality of inverse spurs into the digital phase locked loop causes the wireless device to comply with error vector magnitude requirements for a transmit signal.

27. The apparatus of claim 25 wherein the injection of the plurality of inverse spurs into the digital phase locked loop causes the wireless device to achieve performance requirements for a bit error rate (BER) when receiving data.

* * * * *